United States Patent
Tan et al.

(10) Patent No.: US 6,586,143 B1
(45) Date of Patent: Jul. 1, 2003

(54) ACCURATE WAFER PATTERNING METHOD FOR MASS PRODUCTION

(75) Inventors: Juan Boon Tan, Singapore (SG); Tak Yan Tse, Singapore (SG); Sajan Marokkey Raphael, Singapore (SG); Fang Hong Gn, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 518 days.

(21) Appl. No.: 09/619,359

(22) Filed: Jul. 19, 2000

(51) Int. Cl.[7] .......................... G03F 9/00; H01L 21/302
(52) U.S. Cl. ..................... 430/5; 438/692; 438/693; 438/462; 216/89; 216/90
(58) Field of Search ............................. 430/5; 438/462, 438/692, 693; 216/89, 90

(56) References Cited

U.S. PATENT DOCUMENTS

| | | | |
|---|---|---|---|
| 5,329,334 A | 7/1994 | Yim et al. | 355/53 |
| 5,503,962 A | 4/1996 | Caldwell | 430/317 |
| 5,627,624 A | 5/1997 | Yim et al. | 355/53 |
| 6,074,950 A * | 6/2000 | Wei | 438/692 |

OTHER PUBLICATIONS

"Advanced Process Control: Soon to be a Must", Semiconductor International; (7–991); vol. 22; No. 8; Baliga; pp. 76–86.*

"Characterization and Optimization of Overlay Target Design for Shallow Trench Isolation (STI) Process"; Proc. of SPIE; 1999; vol. 3677, pt. 1–2; pp 217–218; Hsu et al.*

* cited by examiner

*Primary Examiner*—George Goudreau
(74) *Attorney, Agent, or Firm*—George O. Saile; Rosemary L. S. Pike

(57) ABSTRACT

A method for checking the position of alignment marks after a chemical mechanical polishing (CMP) process and automatically compensating for alignment of a wafer stepper based on the position checking is described. A wafer is provided having an alignment mark thereon for the purpose of aligning a reticle in the wafer stepper. The wafer is polished by CMP. Thereafter, alignment mark positioning is checked for deviation from a normal vectorial position of the alignment mark whereby information about the deviation is fed back to the wafer stepper and wherein the wafer stepper automatically compensates for correctable alignment error based on the deviation information.

18 Claims, 2 Drawing Sheets

ACCURATE WAFER PATTERNING METHOD FOR MASS PRODUCTION

BACKGROUND OF THE INVENTION (1) Field of the Invention

The invention relates to the fabrication of integrated circuit devices, and more particularly, to a method of automatically compensating for alignment of a wafer stepper in the fabrication of integrated circuits.

(2) Description of the Prior Art

In the fabrication of integrated circuit devices, multiple layers of conductors and insulators are deposited and patterned to construct the integrated circuit. It is critical to align each subsequent layer with the previous layer with precision. As design rules scale to smaller dimensions, the overlay budget; i.e., the relative displacement between a patterned layer and the previously defined layer, is expected to be reduced. For example, the overlay budget for 0.25 $\mu$m feature size is about 90 nm; for 0.18 $\mu$m feature size, about 70 nm; and for 0.13 $\mu$m feature size, the overlay budget is expected to be 50 nm. The shrinking overlay budget is one of the most difficult obstacles in lithography where level-to-level alignment is concerned, especially in complex structures of metal and contacts or vias.

The overlay tolerance can shrink even further by the use of zero enclosure or borderless design rules, which are gaining popularity among circuit designers due to significant savings in the device area. This means that an accurate mechanism of stepper alignment is needed.

The alignment accuracy of the patterning machine is of particular importance to deliver the overlay budget as stipulated. Today's patterning machines rely very much upon the equipments' capability, including the stage accuracy for wafer and reticle. Alignment is typically accomplished by using alignment marks. A wafer stepper tool uses the alignment marks on a wafer as a reference point for adjusting a reticle over the wafer. The reticle contains the pattern to be generated within the layer. The morphology of the alignment mark is important in determining the quality of alignment. The impact of process variations on the alignment mark implies that robust and extremely tightly controlled variables are required in the process of achieving a very small overlay budget. As far as mass production is concerned, where more than one machine is used for patterning, machine matching will also be required for acceptable overlay performance.

Removal of correctable overlay errors is often achieved through adjustments to stepper parameters. The magnitudes of these process corrections are determined typically by exposing test or pilot wafers 12 and measuring the overlay using the overlay machine,14, as elaborated in FIG. 1. Compensations for stepper alignment are determined 16 and then implemented. In this way, the amount of rework can be reduced significantly as the test wafer is used as a dummy to test the alignment before proceeding with the rest of the wafers 18.

The test wafer procedure normally is conducted in the research and development mode as well as in production when a new device is introduced. This procedure is followed through until the process is stable. However, in many cases, when there is a shift in process conditions, the stepper compensations will be shifted also. As such, misalignment is detected and the test wafer procedure has to be followed through once more.

In a foundry where many types of devices are manufactured, a very thorough data base has to be kept in order to maintain the stepper compensation scheme. This procedure and scheme can be very time consuming and expensive.

U.S. Pat. No. 5,503,962 Caldwell discloses an alignment mark and CMP process in which alignment marks are formed in oxide layers using the same process as for contact and via formation. U.S. Pat. Nos. 5,627,624 and 5,329,334 Yim et al disclose test reticles containing various types and sizes of alignment marks and an alignment mark optimization method. Co-pending U.S. Pat. No. 6,184,104 to J. B. Tan et al, filed on Sep. 10, 1998, teaches the generation of alignment marks only at the oxide layers for use with CMP processes.

SUMMARY OF THE INVENTION

A principal object of the present invention is to provide an effective and very manufacturable method of increasing the accuracy of patterning machines to pattern wafers with minimum overlay.

Another object of the invention is to provide a method of automatically checking the position of alignment marks in the manufacture of integrated circuits.

A further object of the invention is to provide a method of automatically checking the position of alignment marks so that the stepper can compensate for correctable alignment error.

Yet another object is to provide a method of automatically checking the position of alignment marks after a chemical mechanical polishing (CMP) process and providing feedback if a deviation occurs.

A still further object of the invention is to provide a method of checking the position of alignment marks after a chemical mechanical polishing (CMP) process and automatically compensating for alignment of a wafer stepper based on the position checking in the fabrication of integrated circuits.

In accordance with the objects of this invention a method for checking the position of alignment marks after a chemical mechanical polishing (CMP) process and automatically compensating for alignment of a wafer stepper based on the position checking is achieved. A wafer is provided having an alignment mark thereon for the purpose of aligning a reticle in the wafer stepper. The wafer is polished by CMP. Thereafter, alignment mark positioning is checked for deviation from a normal vectorial position of the alignment mark whereby information about the deviation is fed back to the wafer stepper and wherein the wafer stepper automatically compensates for correctable alignment error based on the deviation information.

BRIEF DESCRIPTION OF THE DRAWINGS

In the accompanying drawings forming a material part of this description, there is shown.

DESCRIPTION OF THE PREFERRED EMBODIMENTS

The present invention proposes placing an alignment position checker (APC) system immediately after the polishing step. In normal production, only the oxide thickness is checked in the post chemical mechanical polishing (CMP) process. In the process of the invention, the integral APC system checks the impact of CMP on the quality of the alignment mark automatically and provides feedback if a considerable deviation occurs. This deviation may not be identified by the regular visual inspection or by oxide measurement monitoring of the wafer.

The alignment position checker system of the invention increases the accuracy of the patterning machines to pattern wafers with minimum overlay while removing the need to run a test wafer and check overlay measurement on the test wafer. This reduces overall time to pattern a batch of wafers.

Figure 1:
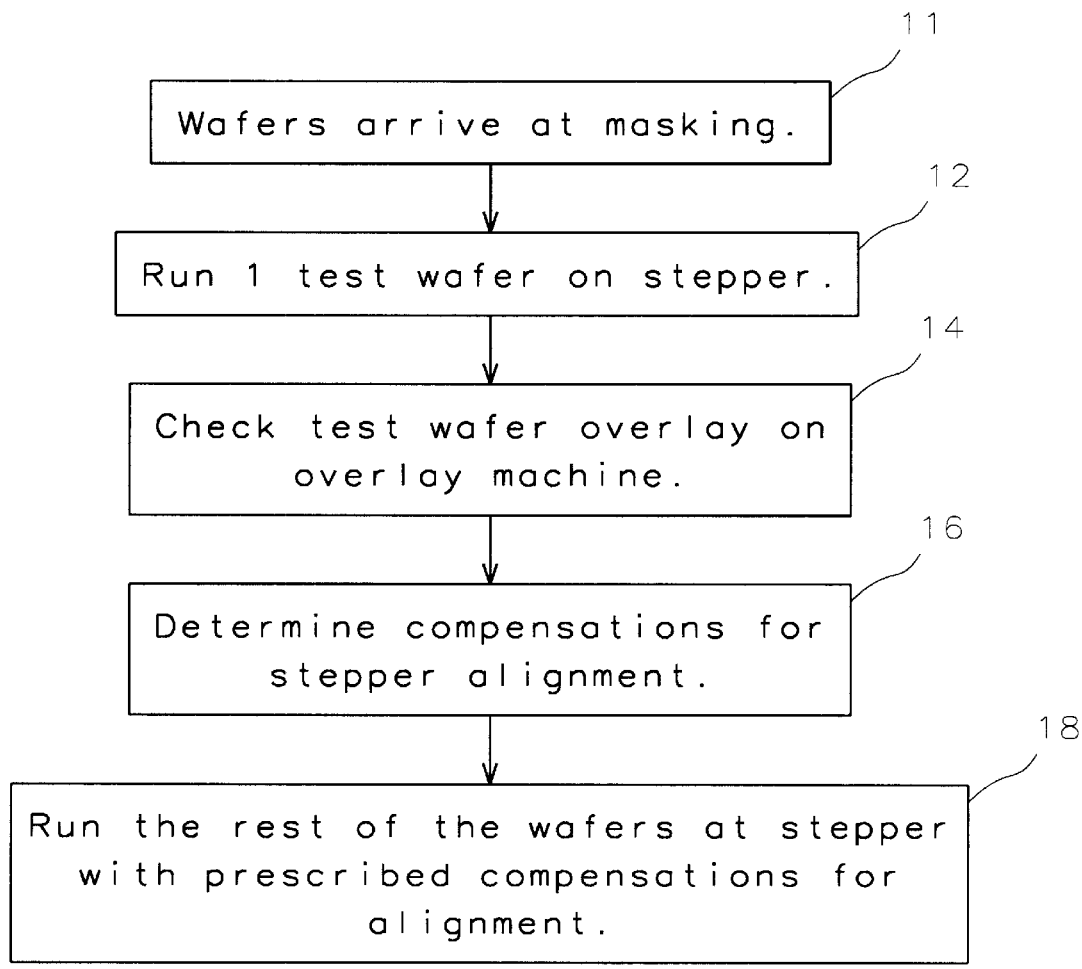
FIG. 1 is a block diagram showing a typical sequence of steps of the prior art carried out to determine stepper compensations required.
Figure 2:
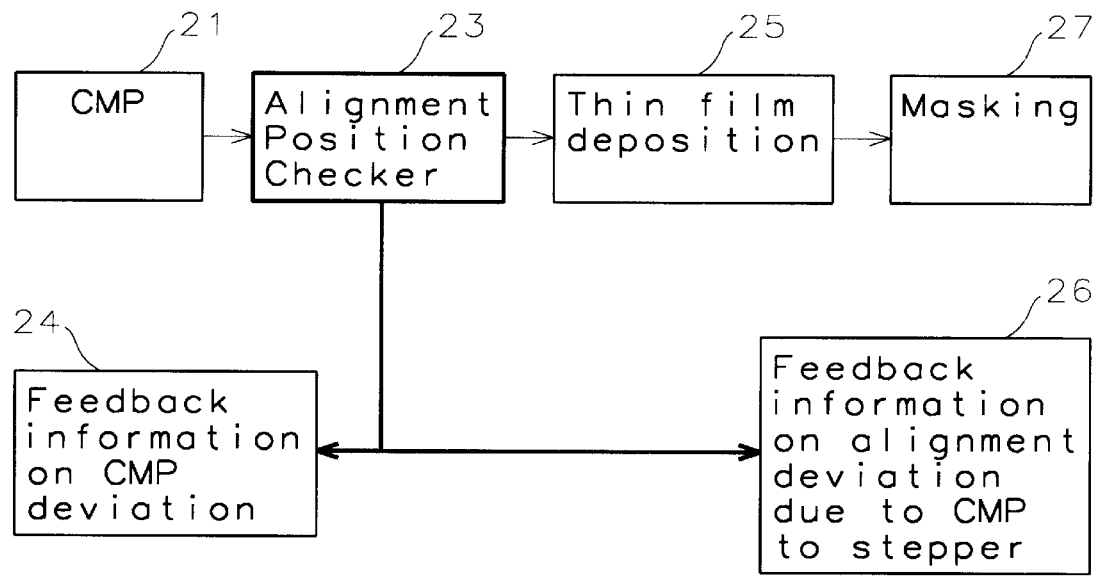
FIG. 2 is a block diagram showing the alignment position checker system of the present invention.

FIG. 2 shows a block diagram of the process of the invention. The Alignment Position Checker 23 is placed immediately after the CMP process 21. Immediately after the wafers are polished, the alignment marks are automatically checked and their positions identified 26. This information is used by the stepper to compensate for correctable alignment error due to process change. Also, the information can be used to alert the operator of the polishing process if there has been any deviation 24. There may or may not be another process such as shown by the dotted box 25 before the masking operation 27.

Figures 3A, 3B:
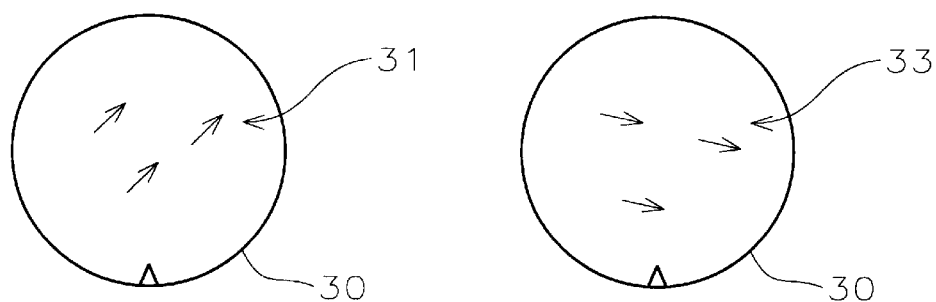
FIG. 3A illustrates a top view of a wafer showing the normal vectorial position of alignment marks detected by the process of the present invention.
FIG. 3B illustrates a top view of a wafer showing deviation in vectorial position of alignment marks detected by the process of the present invention.

FIGS. 3A and 3B elaborate how the information from the APC can be used to alert the operator to a problem. FIG. 3A shows the fingerprint of a regular process. 31 shows the normal vectorial position of the alignment marks on wafer 30. FIG. 3B shows that the fingerprint has been changed. That is, there has been a deviation in vectorial position of the alignment marks 33. The operator needs to be alerted to stop polishing of the next batch of wafers to review the process. The operator is automatically alerted at the CMP process that drift has been detected. No measurement is required to identify this drift.

The stepper uses the information from the alignment position checker to continuously correct the overlay compensation which is initially set to obtain a consistently good overlay. Consider the following equation:

$$S - S_c - O_c = O_n + O_p$$

where S is the vectorial position detected by the stepper, $S_c$ is the automatic compensation by the stepper, $O_c$ is the overlay compensation, $O_n$ is the noncorrectable overlay, and $O_p$ is the overlay due to process deviation. Under normal conditions, $O_p=0$. If there is a deviation that occurs, $O_c$ will be over or under compensation. Thus, the overlay would be out of specification. Knowing $O_p$ from the APC, the compensation can be adjusted automatically to overall compensate the wafer accurately.

The process of the present invention utilizes an Alignment Position Checker to check and identify the position of alignment marks immediately after polishing each wafer. If any deviation in position is detected, the stepper is automatically adjusted to compensate for this deviation. In addition, feedback is provided to an operator as to CMP deviation. This system increases the accuracy of patterning machines to pattern wafers with minimum overlay, removes the need to constantly run test wafers, and improves overall productivity and product cycle.

While the invention has been particularly shown and described with reference to the preferred embodiments thereof, it will be understood by those skilled in the art that various changes in form and details may be made without departing from the spirit and scope of the invention.

What is claimed is:

1. A method of automatically compensating a wafer stepper for correctable alignment error in the fabrication of an integrated circuit device comprising:

providing a wafer having an alignment mark thereon for the purpose of aligning a reticle in said wafer stepper;

polishing said wafer;

thereafter checking for deviation of said alignment mark positioning from a normal vectorial position of said alignment mark whereby information about said deviation is fed back to said wafer stepper and wherein said wafer stepper automatically compensates for correctable alignment error.based on said deviation information;

depositing a thin film on said wafer; and masking said wafer using said reticle in said wafer stepper.

2. The method according to claim 1 wherein any number of said alignment marks may be formed on said wafer and wherein the position of all of said alignment marks is checked.

3. The method according to claim 1 further comprising masking said wafer using said reticle in said wafer stepper after said step of checking for deviation of said alignment mark positioning.

4. The method according to claim 1 wherein said polishing step comprises chemical mechanical polishing.

5. The method according to claim 1 wherein said deviation information is also fed back to an operator of said polishing step.

6. A method of checking alignment mark positioning in the fabrication of an integrated circuit device comprising:

providing a wafer having an alignment mark thereon for the purpose of aligning a reticle in a stepper;

polishing said wafer;

thereafter checking for deviation of said alignment mark positioning from a normal vectorial position of said alignment mark whereby information about said deviation is fed back to said stepper and wherein said stepper automatically compensates for correctable alignment error based on said deviation information;

depositing a thin film on said wafer; and masking said wafer using said reticle in said stepper.

7. The method according to claim 6 wherein any number of said alignment marks may be formed on said wafer and wherein the position of all of said alignment marks is checked.

8. The method according to claim 6 further comprising masking said wafer using said reticle in said stepper after said step of checking for deviation of said alignment mark positioning.

9. The method according to claim 6 wherein said polishing step comprises chemical mechanical polishing.

10. The method according to claim 6 wherein said deviation information is also fed back to an operator of said polishing step.

11. A method of checking alignment mark positioning after polishing in the fabrication of an integrated circuit device comprising:

providing a wafer having an alignment mark thereon for the purpose of aligning a reticle in a stepper;

polishing said wafer;

thereafter checking for deviation of said alignment mark positioning from a normal vectorial position of said alignment mark whereby information about said deviation is fed back to said stepper and wherein said stepper automatically compensates for correctable alignment error based on said deviation information;

thereafter depositing a thin film on said wafer;

masking said wafer using said reticle in said stepper to form a masking layer overlying said thin film; and patterning said thin film using said masking layer to complete said fabrication of said integrated circuit device.

12. The method according to claim 11 wherein any number of said alignment marks may be formed on said wafer and wherein the position of all of said alignment marks is checked.

13. The method according to claim 11 wherein said polishing step comprises chemical mechanical polishing.

14. The method according to claim 11 wherein said deviation information is also fed back to an operator of said polishing step.

15. A method of automatically compensating a wafer stepper for correctable alignment error by checking alignment mark positioning after polishing in the fabrication of an integrated circuit device comprising:

providing a wafer having an alignment mark thereon for the purpose of aligning a reticle in said wafer stepper;

polishing said wafer using chemical mechanical polishing;

thereafter checking for deviation of said alignment mark positioning from a normal vectorial position of said alignment mark whereby information about said deviation is fed back to said wafer stepper and wherein said wafer stepper automatically compensates for correctable alignment error based on said deviation information;

depositing a thin film on said wafer; and masking said wafer using said reticle in said wafer stepper.

16. The method according to claim 15 wherein any number of said alignment marks may be formed on said wafer and wherein the position of all of said alignment marks is checked.

17. The method according to claim 15 further comprising masking said wafer using said reticle in said wafer stepper after said step of checking for deviation of said alignment mark positioning.

18. The method according to claim 15 wherein said deviation information is also fed back to an operator of said polishing step.

* * * * *